(12) United States Patent
Berkemeier et al.

(10) Patent No.: US 10,784,841 B2
(45) Date of Patent: Sep. 22, 2020

(54) KALMAN FILTER FOR AN AUTONOMOUS WORK VEHICLE SYSTEM

(71) Applicants: CNH Industrial America LLC, New Holland, PA (US); Autonomous Solutions, Inc., Mendon, UT (US)

(72) Inventors: Matthew D. Berkemeier, Logan, UT (US); Jeffrey Lee Ferrin, Hyde Park, UT (US); John Arthur Mitsuru Petersen, Providence, UT (US)

(73) Assignees: CNH Industrial America LLC, New Holland, PA (US); Autonomous Solutions, Inc., Mendon, UT (US)

( * ) Notice: Subject to any disclaimer, the term of this patent is extended or adjusted under 35 U.S.C. 154(b) by 253 days.

(21) Appl. No.: 15/915,326

(22) Filed: Mar. 8, 2018

(65) Prior Publication Data

US 2019/0280674 A1 Sep. 12, 2019

(51) Int. Cl.
*H03H 17/02* (2006.01)
*G05D 1/02* (2020.01)
*G05D 1/00* (2006.01)
*G01C 21/16* (2006.01)
(Continued)

(52) U.S. Cl.
CPC ....... *H03H 17/0257* (2013.01); *A01B 69/008* (2013.01); *G01C 21/005* (2013.01); *G01C 21/165* (2013.01); *G05D 1/0088* (2013.01); *G05D 1/02* (2013.01); *G05D 1/027* (2013.01)

(58) Field of Classification Search
CPC .............. H03H 17/0257; A01B 69/008; G01C 21/005; G01C 21/165; G05D 1/0088; G05D 1/02; G05D 1/027
See application file for complete search history.

(56) References Cited

U.S. PATENT DOCUMENTS

| 5,272,639 | A | 12/1993 | McGuffin |
| 5,335,181 | A | 8/1994 | McGuffin |
| 5,450,345 | A | 9/1995 | Raymer et al. |

(Continued)

FOREIGN PATENT DOCUMENTS

| EP | 2555017 A1 | 2/2013 |
| WO | 2014149043 A1 | 9/2014 |

OTHER PUBLICATIONS

International Search Report and Written Opinion of PCT/US2019/021446 dated Jul. 30, 2019 (11 pages).

*Primary Examiner* — Hussein Elchanti
(74) *Attorney, Agent, or Firm* — Rickard K. DeMille; Rebecca L. Henkel

(57) ABSTRACT

A control system for a work vehicle includes a controller, a processor, and a memory that causes the processor to receive, via a sensor assembly, sensor signals and convert the sensor signals into a plurality of entries of a full measurement vector. The memory devices causes the processor to determine a first state vector using IMU Kalman filter, update a first subset of entries the full state vector, determine a second state vector using a spatial positioning Kalman filter, update a second subset of entries the full state vector based on the second state vector, determine a third state vector using a vehicle Kalman filter, update a third subset of entries of the plurality of entries of the full state vector based on the third state vector, and control movement of the work vehicle based on at least one of the first state vector, the second state vector, the third state vector, and the full state vector.

20 Claims, 4 Drawing Sheets

(51) Int. Cl.
   *G01C 21/00* (2006.01)
   *A01B 69/04* (2006.01)

(56) References Cited

U.S. PATENT DOCUMENTS

| | | | |
|---|---|---|---|
| 6,192,305 | B1 | 2/2001 | Schiffmann |
| 6,389,333 | B1 | 5/2002 | Hansman et al. |
| 6,718,259 | B1 | 4/2004 | Khosla |
| 7,046,188 | B2 | 5/2006 | Zaugg et al. |
| 8,239,162 | B2 | 8/2012 | Tanenhaus |
| 8,352,132 | B2 | 1/2013 | Omelchenko et al. |
| 8,509,965 | B2 | 8/2013 | Lin |
| 8,622,150 | B2 | 1/2014 | Burrows et al. |
| 8,639,441 | B2 * | 1/2014 | Natroshvili ............. G01S 19/49 701/480 |
| 8,660,338 | B2 | 2/2014 | Ma et al. |
| 8,725,327 | B2 | 5/2014 | Shroff |
| 8,793,035 | B2 | 7/2014 | Yu et al. |
| 8,812,235 | B2 | 8/2014 | Ingvalson et al. |
| 8,662,419 | B2 | 10/2014 | Bageshwar et al. |
| 8,893,548 | B2 | 11/2014 | Loomis et al. |
| 2003/0185421 | A1 * | 10/2003 | Okamoto ........... G06K 9/00651 382/104 |
| 2011/0153266 | A1 | 6/2011 | Shankwitz et al. |
| 2013/0103344 | A1 | 4/2013 | Bye et al. |
| 2014/0074397 | A1 * | 3/2014 | Vanderwerf ............ G01S 19/47 701/472 |
| 2014/0139374 | A1 | 5/2014 | Wellman et al. |
| 2015/0293207 | A1 * | 10/2015 | Al Zanati ............... G01S 5/163 382/104 |
| 2018/0299293 | A1 * | 10/2018 | Eli .......................... G01C 21/16 |
| 2019/0180451 | A1 * | 6/2019 | Kellner ................. G01S 13/931 |

* cited by examiner

US 10,784,841 B2

KALMAN FILTER FOR AN AUTONOMOUS WORK VEHICLE SYSTEM

BACKGROUND

The disclosure relates generally to a Kalman filter for an autonomous work vehicle system.

Certain autonomous work vehicles are controlled based on a plan that is generated by the autonomous work vehicle and/or a base station, for example. The plan includes a list of tasks to be performed by the autonomous work vehicle. For example, if the autonomous work vehicle is performing agricultural operations (e.g., towing a seeder or planter, harvesting crops, etc.), the plan may include operating in a field with uneven terrain, thereby causing the position of the work vehicle to be offset from a target position. For example, the autonomous work vehicle may be tilling a field along a sloped surface and engage a hole in the surface, whereby the autonomous work vehicle may experience an undesirable position offset (e.g., caused by movement in roll and pitch). As a result the efficiency with which the autonomous work vehicle performs the tilling function may be compromised.

BRIEF DESCRIPTION

In one embodiment, a control system is provided. The control system for a work vehicle includes a controller, a processor, and a memory that causes the processor to receive, via a sensor assembly, sensor signals and convert the sensor signals into many entries of a full measurement vector. The memory devices causes the processor to determine a first state vector using IMU Kalman filter, update a first subset of entries the full state vector, determine a second state vector using a spatial positioning Kalman filter, update a second subset of entries the full state vector based on the second state vector, determine a third state vector using a vehicle Kalman filter, update a third subset of entries of the many entries of the full state vector based on the third state vector, and control movement of the work vehicle based on at least one of the first state vector, the second state vector, the third state vector, and the full state vector.

In another embodiment, a tangible, non-transitory, computer-readable medium is provided. The tangible, non-transitory, computer-readable medium stores instructions executable by a processor, such that the instructions cause the processor to receive, via a sensor assembly, sensor signals and convert the sensor signals into many entries of a full measurement vector. Furthermore, the instructions cause the processor to determine a first state vector using an inertial measuring unit (IMU) Kalman filter based on the full measurement vector and a full state vector, update a first subset of entries of many entries of the full state vector based on the first state vector, determine a second state vector using a spatial positioning Kalman filter based on the full measurement vector and the full state vector, update a second subset of entries of the many entries of the full state vector based on the second state vector, determine a third state vector using a vehicle Kalman filter based on the full measurement vector and the full state vector, update a third subset of entries of the many entries of the full state vector based on the third state vector; and control movement of the work vehicle based on at least one of the first state vector, the second state vector, the third state vector, and the full state vector.

In a further embodiment, a method for controlling an autonomous work vehicle is provided. The method includes receiving, via a sensor assembly communicatively coupled to a processor, sensor signals and converting, via the processor, the sensor signals into many entries of a full measurement vector. Furthermore, the method includes determining, via the processor, a first state vector using an inertial measuring unit (IMU) Kalman filter based on the full measurement vector and a full state vector, updating a first subset of entries of many entries of the full state vector based on the first state vector, determining, via the processor, a second state vector using a spatial positioning Kalman filter based on the full measurement vector and the full state vector, updating a second subset of entries of the many entries of the full state vector based on the second state vector, determining, via the processor, a third state vector using a vehicle Kalman filter based on the full measurement vector and the full state vector, updating a third subset of entries of the many entries of the full state vector based on the third state vector, and controlling, via the processor, movement of the work vehicle based on at least one of the first state vector, the second state vector, the third state vector, and the full state vector.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
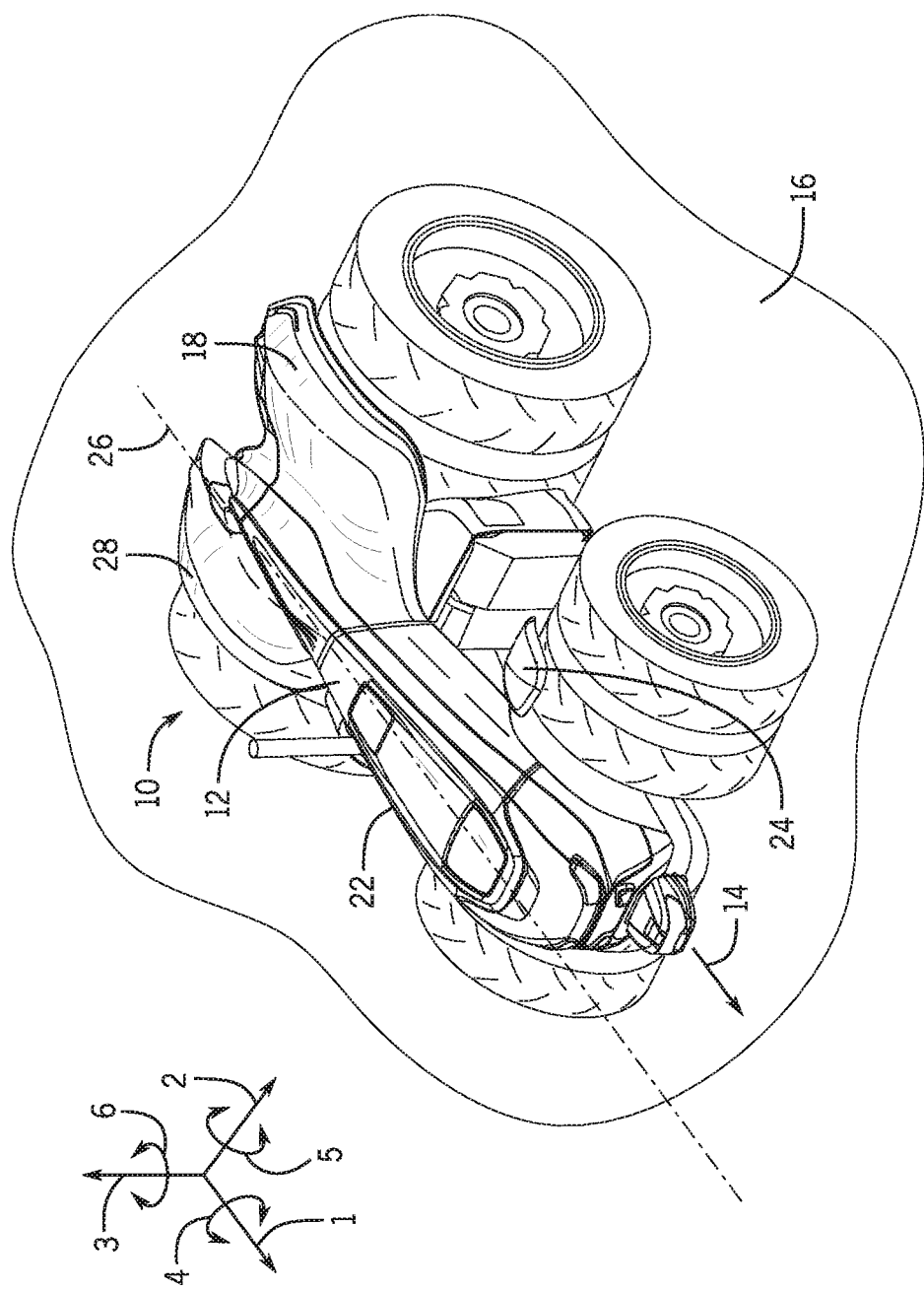
FIG. 1 is a perspective view of an embodiment of an autonomous work vehicle that may include a control system that employs a triplicate Kalman filter.

Typically, the implementation of a Kalman filter uses and accounts for all of the state vectors associated with the dynamics of a system every time computations are performed, thereby making computations intensive, implementation cumbersome, and commercial use impractical. In more detail, the computational complexity of the Kalman filter is dependent on the number of measurements received by a control system. The control system provided herein includes dividing a (e.g., computationally complex) Kalman filter into three Kalman filters, hereinafter collectively called a triplicate Kalman filter, to facilitate computations by reducing computation time. In addition, the three Kalman filters may use a subset of the outputs from the other Kalman filters as measurements (e.g., calculation inputs). For example, an autonomous work vehicle control system may receive 13 measurements, and the autonomous work vehicle may have 21 states. Dividing the Kalman filter into three Kalman filters may result in 5, 8, and 11 measurements, and 6, 12, and 9, states, respectively. Indeed, a portion of the states (e.g., outputs) corresponding to the Kalman filters overlap (e.g., are estimated in more than one filter) and act as inputs to the other filters. As such, the sum does not add up to 21. By using symmetry and redundancy, the triplicate Kalman filter reduces computations otherwise performed by a single Kalman filter. A metric for comparing the two filters (e.g., a single Kalman filter and the triplicate Kalman filter) is the computational complexity of the Kalman gain, defined as:

$$K = PH^T(HPH^T + Q)^{-1} \quad (1)$$

where $p \in s \times s$ and $H \in m \times s$. For the full state filter, m=13 (where m is the number of measurements) and s=21 (where s is the number of states). As will be appreciated, a matrix inverse utilizes about $O(n^{2.4})$ using efficient Linear Algebra Package (LAPACK) algorithms, and that a matrix multiplication utilizes $O(r_1 c_1 c_2)$, where, for example, $r_1$ is the number of rows of the first matrix, $c_1$ is the number of columns of the first matrix, and $c_2$ is the number of columns of the second matrix. Accordingly, utilizing a single Kalman filter requires intensive computations that may require a large amount of computing power and time, in comparison to the triplicate Kalman filter described herein.

Indeed, by using the triplicate Kalman filter, the sensors implemented on the autonomous work vehicle to retrieve measurements may be of lesser cost because utilizing the triplicate Kalman filter may allow for performing calculations at a faster rate, which may result in suitable calculations despite the utilization of sensors with a slower refresh rate, thereby saving money that would otherwise be spent on more expensive sensors with a faster refresh rate, in some instances. Indeed, absent the techniques described herein, performing similar computations by using the single Kalman filter may require expensive sensors with a fast refresh rate and with an ability to receive more accurate data, which may increase costs and complexity to implement a Kalman filter into the autonomous vehicle.

Furthermore, implementing the triplicate Kalman filter disclosed herein may enable the compensation of varying terrain by actuating certain actuators associated with a work vehicle to control movement of the work vehicle. Indeed, in some embodiments, improving the ability to perform computations may improve the ability to determine suitable control gains to actuate actuators (e.g., motors, the suspension, etc.) to control the movement of the work vehicle 10. In some instances a spatial locating antenna may be mounted on the top of the autonomous work vehicle, whereas the control point or point of reference on the autonomous work vehicle may be the point on the ground directly below the center of the rear axle. The triplicate Kalman filter may account for this offset of the spatial locating antenna from the control point by subtracting the offset from the determined position of the spatial locating antenna. However, if the autonomous work vehicle is on a slope, the offset includes roll, pitch, and yaw angles, which the triplicate Kalman filter accounts for. In some embodiments, implementing these offsets may result in more accurate position determination and implementation to improve control of the autonomous work vehicle.

Generally, when implementing one Kalman filter, the controller may wait for inputs from all sensors and for the completion of the prediction (e.g., calculation) of every state in the full state vector of the system. In contrast, the triplicate Kalman filter disclosed herein includes performing calculations on smaller state vectors to increase the rate at which calculations are performed by reducing the complexity of the calculations. In addition, one or more outputs of one of the Kalman filter of the triplicate Kalman filter may serve as an input into another Kalman filter of the triplicate Kalman filter, further reducing the time at which calculations are performed by reducing the complexity of the calculations. The calculations performed by the triplicate Kalman filter may be used to actuate target actuators to control the operation (e.g., movement) of the work vehicle. For example, the controller implementing the triplicate Kalman filter may determine suitable control gains via computational methods (e.g., least-squares estimation, pseudoinverse, etc.), based on the full state vector or the full measurement vector. Furthermore, implementing the triplicate Kalman filter may facilitate dual processing of the sensor data in any combination. For example, when the sensor outputs, sensor data, rather than waiting for all the sensors to be ready, which may add latency for some of the measurements, the measurement(s) can be processed through a Kalman filter of the triplicate Kalman filter as a reduced order system, thereby providing quicker and/or improved updates to the signals received.

While the examples described above and in detail below include computations for the autonomous work vehicle control system receiving 13 measurements for 21 states of the autonomous work vehicle, it should be appreciated that the disclosed subject matter may be applied to any system (e.g., such as an autonomous work vehicle control system) that receives any suitable number of measurements, has any suitable number of states, and has any suitable number of Kalman filters. Furthermore, the disclosed subject matter includes dividing a Kalman filter into three Kalman filters, but the algorithm described below may be implemented in such a way that the Kalman filter may be divided into any suitable number of Kalman filters. For example, the Kalman filter may be divided into 2, 4, 6, 8, or any suitable number of Kalman filters.

Turning now to the drawings, FIG. 1 is a perspective view of an embodiment of an autonomous work vehicle 10 that may include a control system that employs a triplicate Kalman filter. To facilitate discussion, the illustrated embodiment includes a coordinate system with a longitudinal direction/axis 1, a lateral direction/axis 2, and a vertical direction/axis 3. Furthermore, the triplicate Kalman filter may be implemented on a controller associated with a control system of the autonomous vehicle 10 to facilitate the prediction of states and/or control of the autonomous work vehicle 10 in the longitudinal direction 1, the lateral direction 2, and the vertical direction 3. In addition, the triplicate Kalman filter may facilitate prediction of states and/or control of the autonomous work vehicle about the longitudinal axis 1 in roll 4, about the lateral axis 2 in pitch 5, about the vertical axis 3 in yaw 6, or a combination thereof. Indeed, in some embodiments, improving the ability to perform computations (e.g., used to predict the states) may improve the ability to actuate actuators (e.g., motors, the suspension, etc.) and control the operation (e.g., movement) of the work vehicle 10. In some instances, the states of the autonomous work vehicle 10 may be controlled, such as the position, velocity, and acceleration in linear and rotational directions, as well as other states associated with the autonomous work vehicle 10. As such, the triplicate Kalman filter may be implemented on the autonomous work vehicle control system to estimate the states of the autonomous work vehicle 10 by comparing a mathematical model of the system with measurements from sensors. The control system may then use the comparison of the estimates of the states to the measurements from the sensors to determine which actuators (e.g., motors) to actuate to achieve a desired value for the state. Indeed, a control scheme may be implemented to iteratively compare the estimates of the states to the measurements from the sensors to continuously determine which actuators to actuate to achieve a desired state.

The autonomous work vehicle 10 includes a control system configured to implement the triplicate Kalman filter and to perform other operations, such as automatically guiding the work vehicle 10 through a field (e.g., along a direction of travel 14) to facilitate agricultural operations (e.g., planting operations, seeding operations, application operations, tillage operations, harvesting operations, etc.). For example, the control system may automatically guide the autonomous work vehicle 10 along a guidance swath through the field without input from an operator. The control system may also automatically guide the autonomous work vehicle 10 around headland turns between segments of the guidance swath. Furthermore, the control system may actuate certain components of the autonomous work vehicle 10 to adjust the states via any suitable input (e.g., pulse-width modulation (PWM), step-input, impulse-input, etc.) to actuator(s) associated with the autonomous work vehicle 10. Specifically, in some embodiments, the triplicate Kalman filter works in a two-step process. In the prediction step (e.g., the first step), the triplicate Kalman filter may produce estimates of the current states (e.g., state variables), along with their uncertainties. After the outcome of the next measurement (which may include some error and random noise) (e.g., from a sensor) is observed, the estimates may be updated (e.g., via the second step) using a weighted average, with more weight being given to estimates with higher certainty. Indeed the estimates may be updated to desired state, which may be achieved by actuating actuators associated with the desired state. In some embodiments, the algorithm is iterative (e.g., recursive). In some embodiments, the triplicate Kalman filter may be implemented at or near real-time, using the present input measurements and the previously calculated state and its uncertainty matrix, for example, without requiring additional past information.

To facilitate control of the autonomous work vehicle, the control system includes a spatial positioning device, such as a Global Position System (GPS) receiver, which is configured to output position information to a controller of the control system. As discussed in detail below, the spatial positioning device is communicatively coupled to the control system and configured to determine the position and/or orientation of the autonomous work vehicle based at least in part on spatial locating signals.

To further facilitate control of the autonomous work vehicle, the control system may include an inertial measurement unit, which is configured to output roll rate, pitch rate, yaw rate and accelerations in the longitudinal, lateral, and vertical directions associated with the autonomous work vehicle to the controller of the control system. Furthermore, the control system may include additional sensor(s) (e.g., steering sensors, radar velocity sensors, encoders, lasers, sonar sensors, vehicle velocity sensors, vehicle curvature sensors etc.) configured to output any other suitable states associated with the autonomous work vehicle.

In certain embodiments, the controller, the spatial positioning device, the sensors, and/or other device(s) may be positioned beneath a body 12 of the autonomous work vehicle 10. Accordingly, the devices may be positioned below a top side of the body relative to a ground surface 16 along the vertical axis 3. As a result, the top surface of the body 12 may completely cover the controller and/or the spatial positioning device. The body is formed from a material (e.g., fiberglass, a polymeric material, etc.) that facilitates passage of the signals (e.g., GPS signals of about 1 GHz to about 2 GHz) through the body 12. Positioning the controller, the spatial positioning device, and the sensors beneath the body 12 may enhance the appearance of the autonomous work vehicle and/or protect the components from dirt/debris within the field.

In the illustrated embodiment, the body 12 includes a first rear fender 18 on a first lateral side of a longitudinal centerline 26 of the autonomous work vehicle 10. The body 12 also includes a second rear fender 28 on a second lateral side of the longitudinal centerline 26, opposite the first lateral side. As illustrated, each rear fender is positioned over a respective wheel, which is configured to engage the ground surface 16. While each rear fender is positioned over a single wheel, it should be appreciated that in alternative embodiments, one or more of the rear fenders may be positioned over two or more wheels. In addition, if the autonomous work vehicle includes tracks, each rear fender may be positioned over one or more tracks. In certain embodiments, the control system includes a first spatial positioning device positioned beneath the first rear fender 18 and a second spatial positioning device positioned beneath the second rear fender 28. Positioning the spatial positioning devices beneath the rear fenders enables each spatial positioning device to be positioned a greater distance from the longitudinal centerline 26 than spatial positioning devices positioned on a roof of an operator cab (e.g., because the lateral extent of the rear fenders is greater than the lateral extent of the operator cab). As a result, the accuracy of a vehicle orientation determined by the spatial locating receiver and/or the controller may be enhanced. In certain embodiments, at least one spatial positioning device may be positioned beneath the hood 22 and/or the front fender(s) 24 of the autonomous work vehicle 10 (e.g., in addition to the rear fenders or instead of the rear fenders).

Figure 2:
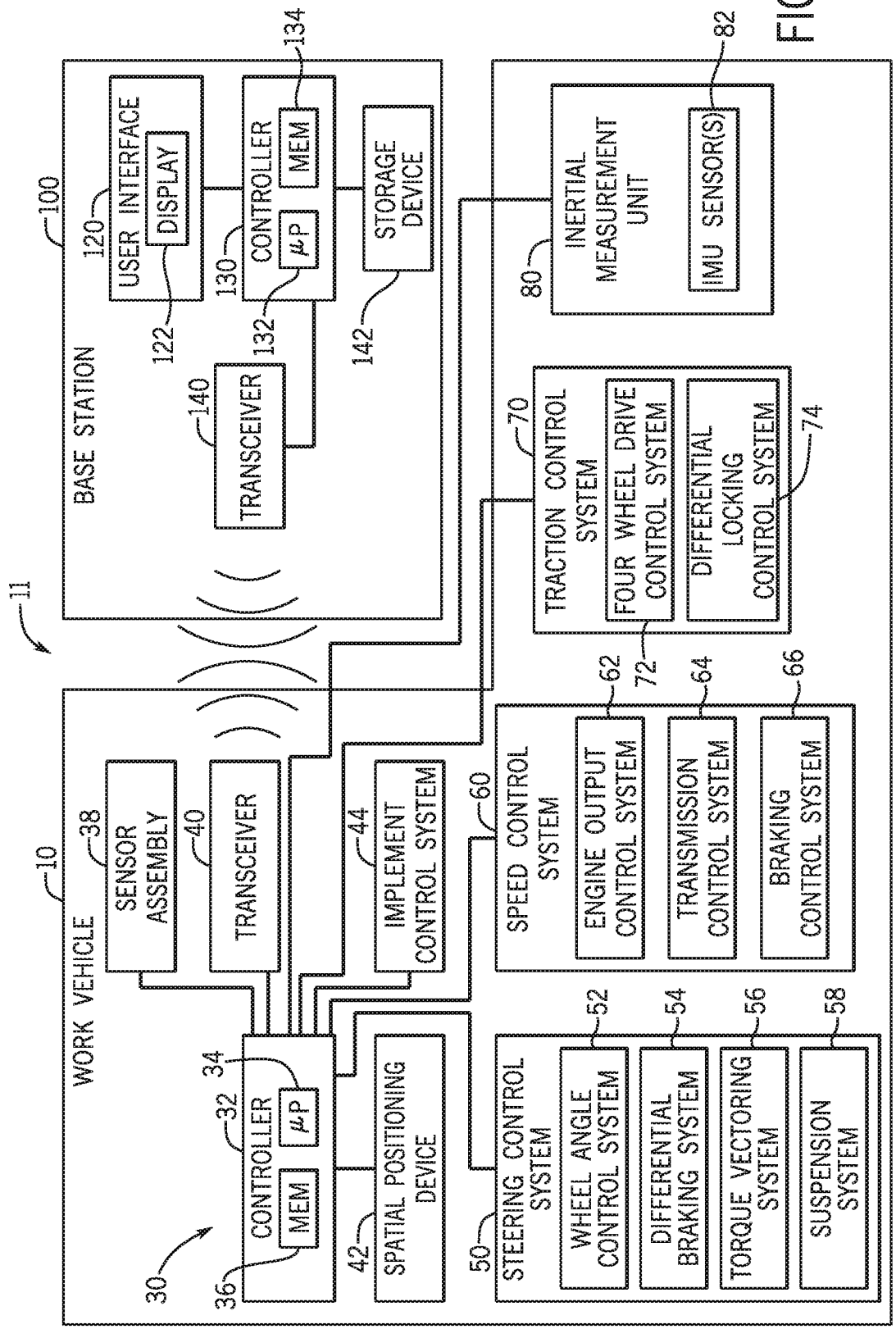
FIG. 2 is a schematic diagram of an embodiment of a control system that may be employed within the autonomous work vehicle of FIG. 1.

FIG. 2 is a schematic diagram of a control system 11 that may be employed within the autonomous work vehicle 10 of FIG. 1 to control the autonomous work vehicle 10, according to an embodiment of the present disclosure. In the illustrated embodiment, the control system 11 includes a work vehicle control system 30 mounted on the autonomous work vehicle 10. Furthermore, the work vehicle control system 30 includes a first transceiver 40 configured to establish a wireless communication link with a second transceiver 140 of a base station 100. The first and second transceivers may operate at any suitable frequency range within the electromagnetic spectrum. For example, in certain embodiments, the transceivers may broadcast and receive radio waves within a frequency range of about 0.5 GHz to about 10 GHz. In addition, the first and second transceivers may utilize any suitable communication protocol, such as a standard protocol (e.g., Wi-Fi, Bluetooth, etc.) or a proprietary protocol.

In the illustrated embodiment, the work vehicle control system 30 includes an inertial measurement unit 80, hereinafter called "IMU," mounted on the autonomous work vehicle 10. In some embodiments, the IMU 80 may include one or more sensors 82 configured to output signals indicative of positions, angles, rotational rates and/or linear accelerations. For example, the IMU 80 may include IMU sensors 82 configured to output signals indicative of the roll angle, the pitch angle, the roll rate, the pitch rate, the roll rate bias, the pitch rate bias, and the like. The IMU 80 is communicatively coupled to the controller, such that the IMU 80 may output signals indicative of the measurements (e.g., roll angle, pitch angle, roll rate, etc.) to the controller 32. The controller 32 may use the measurements as inputs to the triplicate Kalman filter discussed in detail below. For example, the IMU sensors 82 may output signals indicative of the measurements directly to the controller 32 or sensors to IMU controller to controller. In some instances, time information is added to the output signals from the IMU 80.

In the illustrated embodiment, the autonomous work vehicle 10 includes a spatial positioning device 42, which is mounted to the autonomous work vehicle 10 and configured to determine a position of the autonomous work vehicle 10. The spatial positioning device may include any suitable system configured to determine the position of the autonomous work vehicle 10, such as a global positioning system (GPS) or a global navigation satellite system (GNSS), for example. In certain embodiments, the spatial positioning device 42 may be configured to determine the position of the autonomous work vehicle 10 relative to a fixed point within the field (e.g., via a fixed radio transceiver). Accordingly, the spatial positioning device 42 may be configured to determine the position of the autonomous work vehicle 10 relative to a fixed global coordinate system (e.g., via the GPS) or a fixed local coordinate system. In certain embodiments, the first transceiver 40 is configured to broadcast a signal indicative of the position of the autonomous work vehicle 10 to the transceiver 140 of the base station 100.

In addition, the autonomous work vehicle 10 may include a sensor assembly 38. In some embodiments, the sensor assembly may facilitate the autonomous control of the autonomous work vehicle 10. For example, the sensor assembly 38 may be configured to output measurements associated with the autonomous work vehicle 10 that may be used in the triplicate Kalman filter described in detail below. The sensor assembly 38 may include one or more sensors (e.g., infrared sensor(s), capacitance sensor(s), ultrasonic sensor(s), magnetic sensor(s), optical sensor(s) etc.), configured to output measurements associated with the autonomous work vehicle 10, as described in detail below. The signals output by the sensor assembly 38 may be received by the controller 32 for further processing.

In the illustrated embodiment, the work vehicle control system 30 includes a steering control system 50 configured to control a direction of movement of the autonomous work vehicle 10, and a speed control system 60 configured to control a speed of the autonomous work vehicle 10. The speed control system 60 and the steering control system 50 may operate independently of one another (e.g., based at least in part on an autonomous control scheme or highly automated control scheme). In addition, the autonomous work vehicle 10 includes a traction control system 70 configured to control distribution of power from an engine of the autonomous work vehicle 10 to wheels or tracks of the autonomous work vehicle 10, and an implement control system 44 configured to control operation of an implement (e.g., towed by the autonomous work vehicle 10). Furthermore, the work vehicle control system 30 includes a controller 32 communicatively coupled to the first transceiver 40, to the spatial positioning device 42, to the sensor assembly 38, to the steering control system 50, to the speed control system 60, to the traction control system 70, to the implement control system 44, and to the IMU 80.

In certain embodiments, the controller 32 is an electronic controller having electrical circuitry configured to process data from the transceiver 40, the spatial positioning device 42, the sensor assembly 38, the inertial measurement unit 80, or any combination thereof, among other components of the autonomous work vehicle 10. In the illustrated embodiment, the controller 32 includes a processor 34, such as the illustrated microprocessor, and a memory device 36. The controller 32 may also include one or more storage devices and/or other suitable components. The processor 34 may be used to execute software, such as software implementing the triplicate Kalman filter discussed below. Moreover, the processor 34 may include multiple microprocessors, one or more "general-purpose" microprocessors, one or more special-purpose microprocessors, and/or one or more application specific integrated circuits (ASICS), or some combination thereof. For example, the processor 34 may include one or more reduced instruction set (RISC) processors. In some embodiments, the subject matter disclosed herein may be performed by a tangible, non-transitory, and computer-readable medium having instructions stored thereon.

The memory device 36 may include a volatile memory, such as random access memory (RAM), and/or a nonvolatile memory, such as read-only memory (ROM). The memory device 36 may store a variety of information and may be used for various purposes. For example, the memory device 36 may store processor-executable instructions (e.g., firmware or software) for the processor 34 to execute, such as instructions for controlling the autonomous work vehicle 10 based on the triplicate Kalman filter. Furthermore, the memory device 36 (e.g., nonvolatile storage) may include ROM, flash memory, a hard drive, or any other suitable optical, magnetic, or solid-state storage medium, or a combination thereof. The memory device 36 may store data (e.g., measurements such as the roll angle, the pitch angle, the linear accelerations, spatial positioning data, etc.), instructions (e.g., software or firmware for controlling the autonomous work vehicle 10, etc.), and any other suitable data.

In the illustrated embodiment, the steering control system 50 includes a wheel angle control system 52, a differential braking system 54, a torque vectoring system 56, and a suspension system 58. The wheel angle control system 52 may automatically rotate one or more wheels or tracks of the autonomous work vehicle 10 (e.g., via hydraulic actuators) to steer the autonomous work vehicle 10 along a path through the field. By way of example, the wheel angle control system 52 may rotate front wheels/tracks, rear wheels/tracks, and/or intermediate wheels/tracks of the autonomous work vehicle 10, either individually or in groups. The differential braking system 54 may independently vary the braking force on each lateral side of the autonomous work vehicle 10 to direct the autonomous work vehicle 10 along the path through the field. Similarly, the torque vectoring system 56 may differentially apply torque from the engine to wheels and/or tracks on each lateral side of the work vehicle, thereby directing the autonomous work vehicle 10 along the path through the field. Furthermore, the suspension system 58 may include a spring and strut assembly positioned at each wheel/track of the autonomous work vehicle 10. The suspension system 58 may utilize the implementation of the triplicate Kalman filter by the controller 32 to correct the position offsets, thereby using central pitch, central roll, and central yaw. While the illustrated steering control system 50 includes the wheel angle control system 52, the differential braking system 54, the torque vectoring system 56, and the suspension system 58, in alternative embodiments, the steering control system may include one, two, or three of these systems, in any suitable combination. Further embodiments may include a steering control system 50 having other and/or additional systems that may facilitate implementing the triplicate Kalman filter and/or facilitate directing the autonomous work vehicle 10 along the path through the field (e.g., an articulated steering system, etc.).

In the illustrated embodiment, the speed control system 60 includes an engine output control system 62, a transmission control system 64, and a braking control system 66. The engine output control system 62 is configured to vary the output of the engine to control the speed of the autonomous work vehicle 10. For example, the engine output control system 62 may vary a throttle setting of the engine, a fuel/air mixture of the engine, a timing of the engine, other suitable engine parameters, or a combination thereof, to control engine output. In addition, the transmission control system 64 may adjust gear selection or transmission input-output ratio within a transmission to control the speed of the autonomous work vehicle 10. Furthermore, the braking control system 66 may adjust braking force, thereby controlling the speed of the autonomous work vehicle 10. While the illustrated speed control system 60 includes the engine output control system 62, the transmission control system 64, and the braking control system 66, in alternative embodiments, the speed control system may include one or two of these systems, in any suitable combination. Further embodiments may include a speed control system having other and/or additional systems to facilitate adjusting the speed of the autonomous work vehicle 10.

In the illustrated embodiment, the traction control system 70 includes a four wheel drive control system 72 and a differential locking control system 74. The four wheel drive control system 72 is configured to selectively engage and disengage a four wheel drive system of the autonomous work vehicle 10. For example, in certain embodiments, the autonomous work vehicle 10 may include a four wheel drive system configured to direct engine output to the rear wheels/tracks while disengaged, and to direct engine output to the front wheels/tracks and the rear wheels/tracks while engaged. In such embodiments, the four wheel drive control system 72 may selectively instruct the four wheel drive system to engage and disengage to control traction of the autonomous work vehicle 10. In certain embodiments, the autonomous work vehicle 10 may include intermediate wheels/tracks positioned between the front wheels/tracks and the rear wheels/tracks. In such embodiments, the four wheel drive control system 72 may also control the transfer of engine power to the intermediate wheels.

In addition, the differential locking control system 74 is configured to selectively engage a differential locking system of at least one locking differential between a respective pair of wheels/tracks. For example, in certain embodiments, a locking differential is positioned between the rear wheels/tracks and configured to transfer engine power to the rear wheels/tracks. While the differential locking system is disengaged, the differential is unlocked. As a result, the rotational speed of one rear wheel/track may vary relative to the rotational speed of the other rear wheel/track. However, when the differential locking system is engaged, the differential is locked. As a result, the rotational speeds of the rear wheels/tracks may be substantially equal to one another. In certain embodiments, a locking differential may be positioned between the front wheels/tracks and/or between intermediate wheels/tracks. In some embodiments, a center differential may selectively lock the front and rear axles. In certain embodiments, the differential locking control system 74 is configured to independently engage and disengage the differential locking system of each locking differential. While the illustrated traction control system 70 includes the four wheel drive control system 72 and the differential locking control system 74, in alternative embodiments, the traction control system may include only one of these systems. Further embodiments may include a traction control system having other and/or additional systems to facilitate control of traction of the autonomous work vehicle 10.

The implement control system 44 is configured to control various parameters of an agricultural implement that may be towed by the autonomous work vehicle 10. For example, in certain embodiments, the implement control system 44 may be configured to instruct an implement controller (e.g., via a communication link, such as a CAN bus or ISOBUS) to adjust a penetration depth of at least one ground engaging tool of the agricultural implement. By way of example, the implement control system 44 may instruct the implement controller to reduce the penetration depth of each tillage point on a tilling implement, or the implement control system 44 may instruct the implement controller to disengage each opener disc/blade of a seeding/planting implement from the soil. Reducing the penetration depth of at least one ground engaging tool of the agricultural implement may reduce the draft load on the autonomous work vehicle 10. Furthermore, the implement control system 44 may instruct the implement controller to transition the agricultural implement between a working position and a transport portion, to adjust a flow rate of product from the agricultural implement, or to adjust a position of a header of the agricultural implement (e.g., a harvester, etc.), among other operations.

In certain embodiments, the autonomous work vehicle controller 32 may directly control the penetration depth of at least one ground engaging tool of the agricultural implement. For example, the controller 32 may instruct a three-point hitch (e.g., via a three-point hitch controller) to raise and lower the agricultural implement or a portion of the agricultural implement relative to the soil surface, thereby adjusting the penetration depth of the at least one ground engaging tool of the agricultural implement. In addition, the controller 32 may instruct a hydraulic control system to adjust hydraulic fluid pressure to one or more actuators on the agricultural implement, thereby controlling the penetration depth of respective ground engaging tool(s).

As previously discussed, the autonomous work vehicle 10 is configured to communicate with the base station 100 via the transceivers 40 and 140. In the illustrated embodiment, the base station 100 includes a base station controller 130 communicatively coupled to the base station transceiver 140. The base station controller 130 is configured to output commands and/or data to the autonomous work vehicle control system 30. For example, the base station controller 130 may output the calculations associated with the triplicate Kalman filter discussed in detail below to the controller 32, and/or the base station controller 130 may instruct the work vehicle to follow a selected/planned path through the field.

In certain embodiments, the base station controller 130 is an electronic controller having electrical circuitry configured to process data from certain components of the base station 100 (e.g., the transceiver 140). In the illustrated embodiment, the base station controller 130 includes a processor 132, such as the illustrated microprocessor, and a memory device 134. The processor 132 may be used to execute software, such as software for providing commands and/or data to the work vehicle controller 32, and so forth. Moreover, the processor 132 may include multiple microprocessors, one or more "general-purpose" microprocessors, one or more special-purpose microprocessors, and/or one or more application specific integrated circuits (ASICS), or some combination thereof. For example, the processor 132 may include one or more reduced instruction set (RISC) processors. The memory device 134 may include a volatile memory, such as RAM, and/or a nonvolatile memory, such as ROM. The memory device 134 may store a variety of information and may be used for various purposes. For example, the memory device 134 may store processor-executable instructions (e.g., firmware or software) for the processor 132 to execute, such as instructions for performing the calculations below to implement the triplicate Kalman filter and/or providing commands to the work vehicle controller 32.

In the illustrated embodiment, the base station 100 includes a user interface 120 communicatively coupled to the base station controller 130. The user interface 120 is configured to present data from the autonomous work vehicle 10 and/or the agricultural implement to an operator (e.g., data associated with operation of the autonomous work vehicle 10, data associated with operation of the agricultural implement, etc.). The user interface 120 is also configured to enable an operator to control certain functions of the autonomous work vehicle 10 (e.g., starting and stopping the autonomous work vehicle 10, instructing the autonomous work vehicle 10 to follow a selected/planned route through the field, implementing the triplicate Kalman filter, etc.). In the illustrated embodiment, the user interface 120 includes a display 122 configured to present information to the operator, such as the position of the autonomous work vehicle 10 within the field, the speed of the work vehicle, the path of the work vehicle, and the status of the implementation of the triplicate Kalman filter, among other data.

In the illustrated embodiment, the base station 100 includes a storage device 142 communicatively coupled to the base station controller 130. The storage device 142 (e.g., nonvolatile storage) may include ROM, flash memory, a hard drive, or any other suitable optical, magnetic, or solid-state storage medium, or a combination thereof. The storage device(s) may store data (e.g., measurements, etc.), instructions (e.g., software or firmware for commanding the autonomous work vehicle 10, etc.), and any other suitable data.

In some embodiments, the sensor assembly 30, the spatial positioning device 42, the implement control system 44, the steering control system 50, the speed control system 60, the traction control system 70, the IMU 80, and the like may be communicatively coupled to the base station controller (e.g., via transceiver 40, 140), such that the sensor assembly 30, the spatial positioning device 42, the implement control system 44, the steering control system 50, the speed control system 60, the traction control system 70, the IMU 80, and the like may output corresponding data (e.g., measurements) to the base station controller for implementation of the triplicate Kalman filter. In some embodiments, the data is output to the work vehicle controller 32 before being output to the base station controller 130 via transceivers 40 and 140.

While the control system 30 of the autonomous work vehicle 10 includes the controller 32 in the illustrated embodiment, it should be appreciated that in alternative embodiments, the control system 30 may include the base station controller 130. For example, in certain embodiments, control functions of the control system 30 may be distributed between the work vehicle controller 32 and the base station controller 130. In further embodiments, the base station controller 130 may perform a substantial portion of the control functions of the control system 30. In addition, the base station controller 130 may output instructions to the work vehicle controller 32 (e.g., via the transceivers 40 and 140), instructing the autonomous work vehicle 10 and/or the agricultural implement to perform certain operations (e.g., instructions to adjust the speed and/or suspension based on the triplicate Kalman filter to correct for position offsets, etc.).

Figure 3:
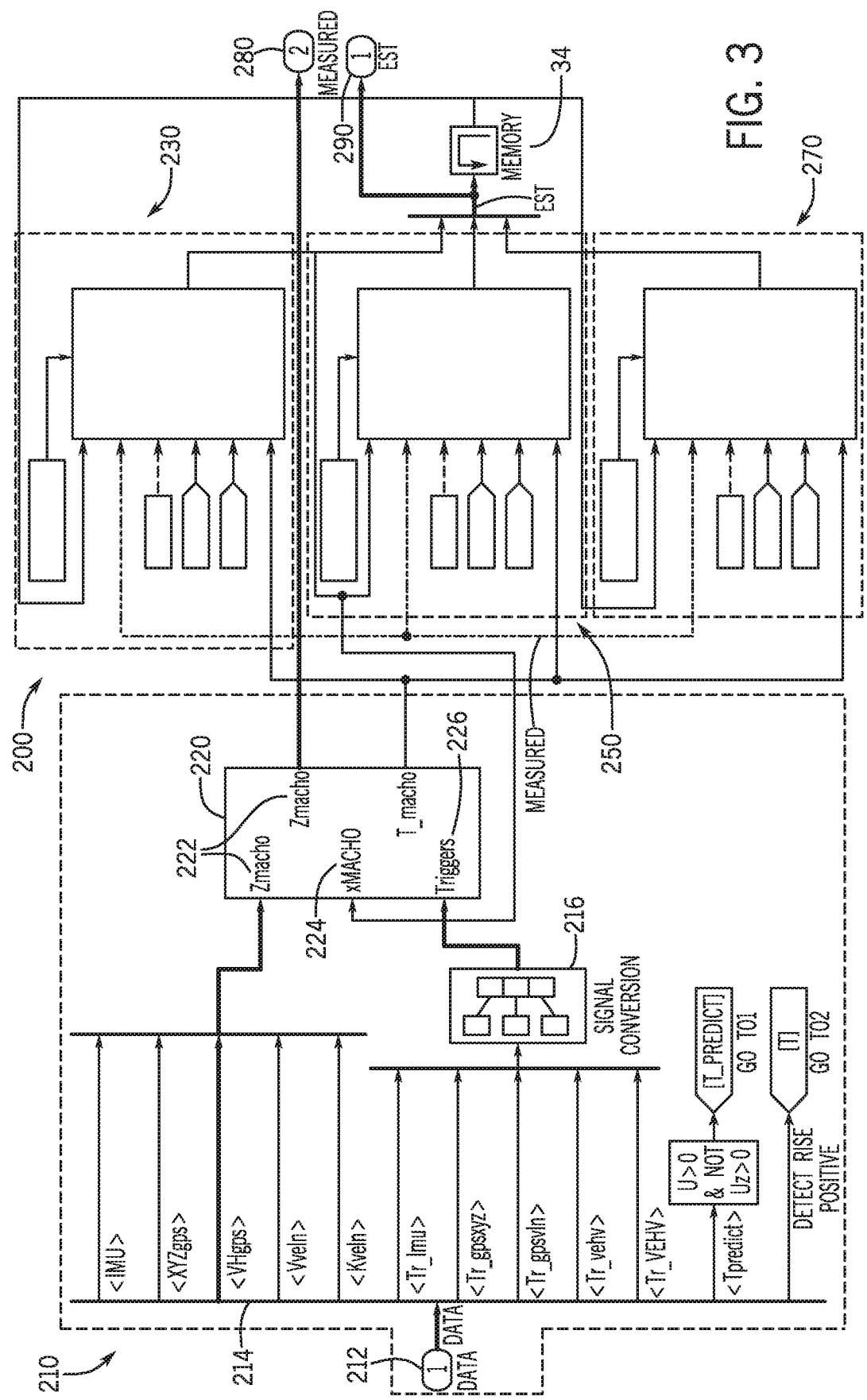
FIG. 3 is a block diagram of an embodiment of an algorithm that implements a triplicate Kalman filter for controlling the autonomous work vehicle of FIG. 1.

FIG. 3 illustrates a block diagram of an embodiment of the algorithm 200 that implements a triplicate Kalman filter 201 for controlling the autonomous work vehicle 10 of FIG. 1. In the illustrated embodiment, the algorithm 200 includes a data gathering stage 210, in which measurements are received from the sensor assembly 38, the spatial positioning device 42, and IMU 80 (e.g., IMU sensor 82). Furthermore, the algorithm 200 includes three individual Kalman filters, an IMU Kalman filter 230, a GPS Kalman filter 250, and a Vehicle Kalman filter 270, which are described in detail below with regards to FIG. 4. Hereinafter, the "measurements" of the measurement phase refers to data received from various sensors (e.g., the sensor assembly 38, the spatial positioning device 42, the IMU sensor 82), and the "estimates" of the prediction phase refers to the corresponding values determined/calculated utilizing the equations disclosed below.

Triplicate Kalman Filter Overview

The three Kalman filters (e.g., the IMU Kalman filter 230, the GPS Kalman filter 250, and the Vehicle Kalman filter 270) in the triplicate Kalman filter 201 are identical in structure, but each includes a prediction phase and a measurement phase that are unique to the respective filter. In short, during the measurement phase (e.g., data gathering phase 210), the Kalman filter receives measurements via sensors for a full measurement vector, and during the prediction phase, the Kalman filter executes the algorithm 200 to calculate suitable values for a full state vector used to facilitate control the autonomous work vehicle. The triplicate Kalman filter 201 also includes an update phase that has been modularized for each of the three Kalman filters so that the update phase may be activated by each of the three filter, independently from one another, thereby enabling certain Kalman filters to use outputs from other Kalman filters as inputs (e.g., the Vehicle Kalman filter 270 may use the outputs from the GPS Kalman filter 250 as inputs). That is, the estimates (e.g., predicted states) output from the prediction phase of one Kalman filter (e.g., the Vehicle Kalman filter 270) may be used as inputs to perform the calculations for the prediction phase of another filter (e.g., the IMU Kalman filter 230). Indeed, in some embodiments, due to each of the three Kalman filters being modularized may facilitate the use of outputs from other Kalman filters as inputs to a different Kalman filter, thereby reducing the computational complexity.

The prediction phase(s) associated with the three Kalman filters in the triplicate Kalman filter 201 may execute periodically, and independently from one another, based on corresponding triggers 226. For example, the prediction phase for the IMU Kalman filters 230 may receive triggers 226 every 1 ms, 10 ms, 100 ms, or any suitable time period, thereby causing the controller to perform calculations to predict the states associated with the IMU Kalman filter. In some embodiments, after the measurements sufficient to perform the calculations to predict the next states for the IMU Kalman filter 230 are available, the controller may cause the trigger 226 corresponding to the IMU Kalman filter 230 to initiate the prediction phase to predict (e.g., via performing calculations) the estimates for the state vectors of the IMU Kalman filter 230. After completion of the prediction phase, then the measurement phase follows. A similar process may be performed by the GPS Kalman filter 250 and the Vehicle Kalman filter 270.

Each of the three Kalman filters 230, 250, and 270 have access to the full set of states in a state vector (xMACHO 224), and all of the measurements stored in a full set measurement vector (Zmacho 222). Accordingly, the full-state vector (xMACHO 224) and the full measurement vector (Zmacho 222), and their respective values, are made available to each Kalman filter 230, 250, and 270, thereby providing the latest estimates (e.g., the most recent calculated/predicted values) to any of the equations for each Kalman filter implemented by the controller, as described in detail below. As illustrated, all of the sensor data 212 is brought together into the full measurement vector (Zmacho 222). In addition, executing algorithm 200 may include updating the full state vector (xMACHO 224).

Within the data gathering stage 210 of the illustrated embodiment, sensor data 212 is received from the sensor assembly 38, the spatial positioning device 42, the IMU 80, or a combination thereof. Furthermore, during the triggering stage 220, triggers 226 activate to signify that one or more measurements (e.g., updates to the full-measurement vector (Zmacho 222)) are available for processing. In some embodiments, the sensor data 212 is used to propagate the states (e.g., variables) of the full-measurement vector (Zmacho 222). For example, within the data gathering stage 210, sensor data 212 indicative of the speed and heading from the GPS (VHgps 214) are transformed into horizontal (Vx) and Vertical (Vy) components of velocity, via a signal conversion stage 216 to update these corresponding values in the full-measurement vector (Zmacho 222). In some instances, converting the sensor data 212 indicative of the speed and heading from the GPS (VHgps 214) into horizontal (Vx) and Vertical (Vy) components of velocity may reduce heading noise as the total velocity approaches zero, as is shown below with regards to equation 23. Although only a discussion regarding sensor data 212 indicative of the velocity and heading from the GPS (VHgps 214) is discussed above, it should be noted that similar steps are performed for the other sensor data 212 (e.g., IMU, XYZgps, Vveln, Kveln, etc.) illustrated on FIG. 3.

Furthermore, after sensor data 212 is received and the sensor data is fed into the triggering stage 220, in which the triggers 226 activate to signify that certain values in the full-measurement vector have been updated, the three Kalman filters 230, 250, and 270 may perform the calculations described in detail below. In some embodiments, the triggers 226 may receive an indication that certain measurements have been received (e.g., in the full measurement vector (ZMacho 222)), thereby initiating the performances of certain calculations described below. Additionally or alternatively, triggers 226 may be used to delay the measurement for those states by one cycle (e.g., 10 ms) or any number of suitable cycles. Furthermore, in some embodiments, each Kalman filter 230, 250 and 270 is initialized with indices for the triggers that apply to the respective filter. These triggers are then monitored by the controller to determine when to execute the update portion of the Kalman filters (e.g., update the values in the full-measurement vector (ZMacho 222)).

In some embodiments, the full measurement vector (ZMacho 222) may be stored as measured values 280 once the measured values are received from the sensor assembly 38, the spatial positioning device 42, the IMU sensors 82, or a combination thereof. The measured values 280 may be time stamped. The memory device may store the measured values 280 to enable the controller to access the measured values 280 corresponding to the entries of the full measurement vector (ZMacho 222). In some embodiments, the controller may retrieve measured values 280 stored in the full measurement vector (ZMacho 222) to perform the calculations described in detail below, whereby the states corresponding to the state vector associated with the IMU Kalman filter, the GPS Kalman filter, and the Vehicle Kalman filter are calculated (e.g., predicted).

Furthermore, in some embodiments, the calculated estimate values 290 corresponding to the state vectors associated with the respective Kalman filters 230, 250, and 270 may be stored in the memory device, and used to control the autonomous work vehicle. Specifically, by knowing the current state and the previous state, the controller may be configured to determine the action that caused the change in state, which may facilitate controlling the autonomous work vehicle. In some embodiments, the full-state vector (xMACHO 224), the full-measurement vector (ZMacho 222), or any combination thereof may be updated based on the calculated estimate values 290. Specifically, in some embodiments, when the position, velocity, and accelerations of the autonomous work vehicle can be predicted (e.g., estimated using the algorithm 200), the autonomous work vehicle may be controlled by determining a suitable number of control gains that may cause the autonomous work vehicle to achieve a desired motion.

General Purpose Kalman Filter Update

A general purpose Kalman filter is used to determine the correction to the estimate using standard Kalman filter update equations, such as equations 2, 3, and 4 below.

$$K = P_k H_k^T (H_k P_k H_k^T + Q)^{-1} \quad (2)$$

$$\mu^{k+1} = \mu^k + K(z-h) \quad (3)$$

The covariance matrix, μ, is then updated with $$P_{k+1} = (I - KH_k) P_k (I - KH_k)^T + KQ_k K \quad (4)$$

where, as mentioned above, P∈s×s and H∈m×s. For the full state filter with m=13 (number of measurements) and s=21 (number of states).

Indexing State and Measurement Vectors

Figure 4:
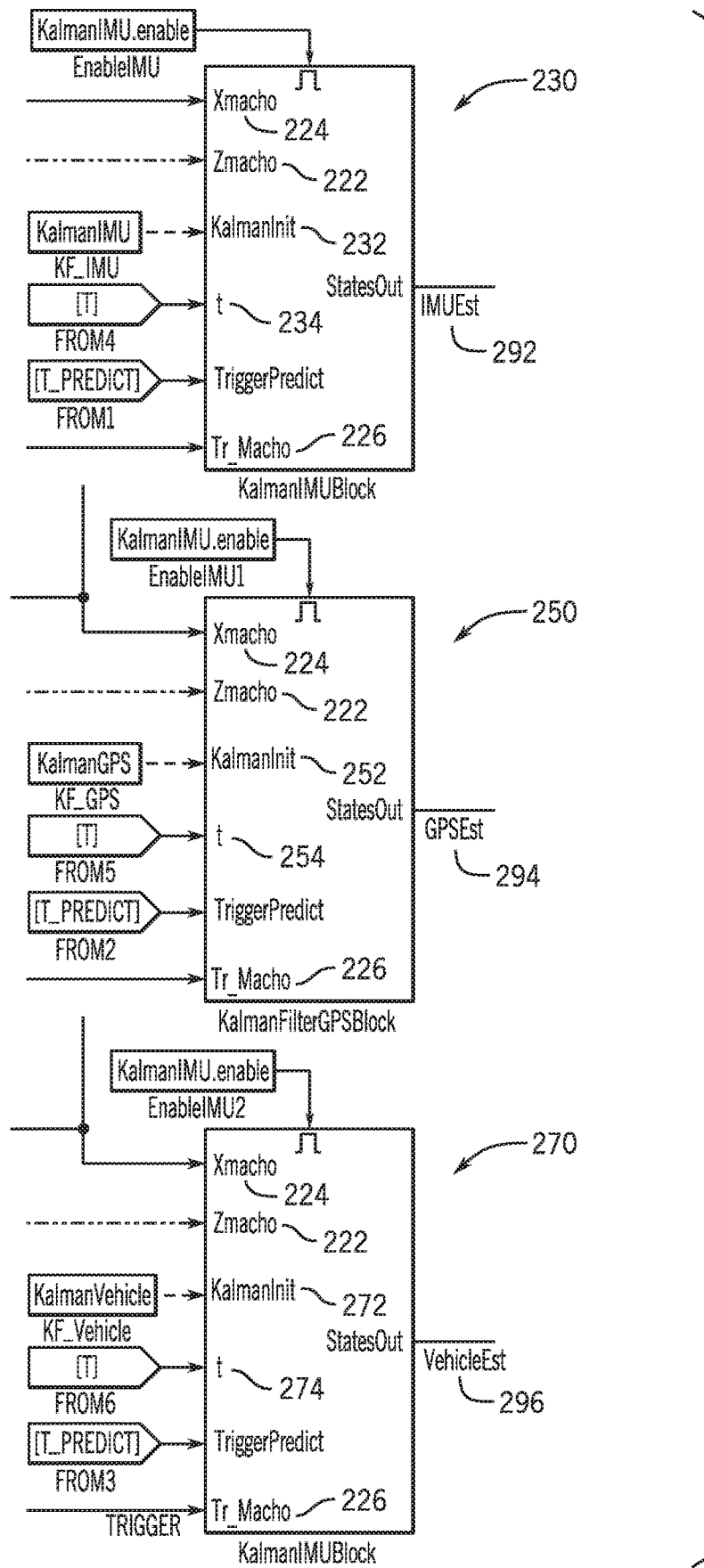
FIG. 4 is a block diagram an embodiment of algorithms of the three Kalman filters of the triplicate Kalman filter of FIG. 3.

Each Kalman filter 230, 250, and 270 is initialized with a configuration of respective indices 232, 252, 272, illustrated in FIG. 4, such that the indices correspond to the states and measurements associated with the filter. The indices are used to define the rows and/or columns associated with the states (e.g., entries or variables) of the full state vector (xMACHO 224), $\mu_{macho}$, of equation 5, the full measurement vector (Zmacho 222), $z_{macho}$, of equation 6, the process and measurement matrices, and process and measurement noise covariance matrices discussed below. The full state vector (xMACHO 224) and the full measurement vector (Zmacho 222) defined in equations 5 and 6, respectively, as:

$$\mu_{macho} = [\phi_1 \, \theta_1 \, p \, q \, b_p \, b_q \, x_1 \, y_1 \, z_1 \, v_{x1} \, v_{y1} \, v_{z1} \, a_x \, a_y \, a_z \\ b_{ax} \, b_{ay} \, b_{az} \, x \, y \, z \, \phi \, \theta \, \psi \, \nu \, \kappa \, b_r]^T \quad (5)$$

and $$z_{macho} = [p_i \, q_i \, r_i \, a_{ix} \, a_{iy} \, a_{iz} \, x_g \, y_g \, z_g \, v_{gx} \, v_{gy} \, v_v \, \kappa_v \, \phi_1 \, \theta_1 \, x_1 \\ y_1 \, z_1 \, v_{1x} \, v_{1y} \, v_{1z}]^T \quad (6)$$

where the macho subscript signifies the full state vector (xMACHO 224), the subscript 1 of $\Phi_1$, $\theta_1$, $x_1$, $y_1$, $z_1$, $v_{x1}$, $v_{y1}$, and $v_{z1}$ in the state vector μ of equation 5 signifies that the state is used as a input to another filter, the subscript i signifies measurements from the IMU 80, the subscript g signifies measurements from the spatial positioning device (e.g. "GPS"), and the subscript v signifies measurements available from the sensor assembly of the autonomous work vehicle. Furthermore, the states used to define the full state vector (xMACHO 224) the full measurement vector (Zmacho 222) are defined below. In the illustrated embodiment, each Kalman filter 230, 250, and 270 is initialized with a structure that includes indices for the full state vector (xMACHO 224), and for the full measurement vector (Zmacho 222). For example, the values for the states corresponding to the IMU Kalman filter are $\mu_{imu}=[\phi_1\ \theta_1\ p\ q\ b_p\ b_q]^T$, as defined below in equation 7, such that the full state vector (xMACHO 224) is received. In addition, the values of the states may be rearranged to be in the order defined in the respective Kalman filter.

FIG. 4 is a block diagram of algorithms of the three Kalman filters of the triplicate Kalman filter 201 of FIG. 3. The illustrated embodiment includes the IMU Kalman filter 230, the GPS Kalman filter 250, and the Vehicle Kalman filter 270. Furthermore, as described in detail below, the three Kalman filters (e.g., the IMU Kalman filter 230, the GPS Kalman filter 250, and the Vehicle Kalman filter 270) of the triplicate Kalman filter 201 may predict states during the prediction phase and may determine measurements from the sensor assembly 38, the IMU 80, the spatial positioning device (e.g., GPS), or a combination thereof.

IMU Kalman Filter Prediction Phase

The IMU Kalman filter 230 receives inertial measurements of rotational rates and linear accelerations from the IMU sensors 82. In some embodiments, the measurements may be selected by the controller 32 from the full measurement vector (Zmacho 222). Furthermore, the IMU Kalman filter 230 determines (e.g., estimates) roll and pitch angles, roll and pitch rates, and their biases to update the full state vector (xMACHO 224). The IMU state vector includes a subset of the vectors from the full state vector (xMACHO 224) and is defined in equation 7 as:

$$\mu_{imu}=[\phi_1\ \theta_1\ p\ q\ b_p\ b_q]^T \quad (7)$$

in which $\Phi_1$ represents the roll angle associated with the autonomous work vehicle 10, $\theta_1$ represents the pitch angle associated with the autonomous work vehicle 10, p represents the roll rate associated with the autonomous work vehicle 10, q represents the pitch rate associated with the autonomous work vehicle 10, $b_p$ represents the roll rate bias, T indicates that the vector is transposed, and $b_q$ pitch rate bias.

In some embodiments, the IMU vector of equation 7 may be an initialized vector 232, such that all of its entries include a value of 1 to facilitate computations. Furthermore, the roll and pitch angles are subscripted with a 1 to denote that the roll and pitch angles are the first estimate of these angles. A second estimate of these angles is made with the Vehicle Kalman filter 270. The states are predicted (e.g., calculated) at each control cycle by accounting for the orientation and the rotation rates of the vehicle using equation 8.

$$\mu_{imu}^{k+1} = \mu_{imu}^k + \Delta t \begin{bmatrix} (q\sin\phi_1 + r\cos\phi_1)\tan\theta_1 + p \\ (q\cos\phi_1 - r\sin\phi_1) \\ 0 \\ 0 \\ 0 \\ 0 \end{bmatrix}_k \quad (8)$$

where the superscript k denotes the current state value and k+1 denotes the newly updated IMU state 292. The variable r represents the yaw rate and is computed using the states V and $\kappa$ from the vehicle Kalman filter with equation 9.

$$r=v\kappa \quad (9)$$

To measure the variability of the transformation from the IMU state values, k, to the newly updated IMU state 292, k+1, in some embodiments, the IMU covariance may be calculated according to equation 11. Before obtaining the IMU covariance, equation 8 is linearized according to equation 10 to obtain that state transition matrix, $G_{imu}$, as follows:

$$G_{imu} = I_6 + \Delta t \begin{bmatrix} (q\cos\phi_1 - r\sin\phi_1)\tan\theta_1 & (q\sin\phi_1 + r\cos\phi_1)\sec^2\theta_1 & 1 & \sin\phi_1\tan\theta_1 & 0 & 0 \\ -(q\sin\phi_1 + r\cos\phi_1) & 0 & 0 & \cos\theta_1 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \end{bmatrix} \quad (10)$$

where $I_6$ is the 6×6 identity matrix and $\Delta t$ is the elapsed time 234 since the last cycle. The covariance for the IMU Kalman filter 230, hereinafter called the IMU covariance, $p_{imu}^{k+1}$, is then updated with the state transition matrix $G_{imu}$ and the process noise covariance matrix, $R_{imu}$, which includes signal noise, shown in equation 11. The covariance matrix may provide an unscaled correlation of the inputs into the IMU Kalman filter 230, received as outputs from another Kalman filter. Furthermore, the covariance matrix may be used to fit a multivariate Gaussian distribution to the inputs into the IMU Kalman filter 230.

$$P_{imu}^{k+1}=G_{imu}P_{imu}^k G_{imu}^T+R_{imu} \quad (11)$$

IMU Kalman Filter Measurement Phase

The IMU measurement vector is defined in equation 12 as $$z_{imu}=[a_{ximu}\ a_{yimu}\ a_{zimu}\ p_{imu}\ q_{imu}]^T \quad (12)$$

where the acceleration in the x direction (e.g., longitudinal direction) is represented as $a_{ximu}$, the acceleration in the y direction (e.g., lateral direction) is represented as $a_{yimu}$, acceleration in the z direction (e.g., vertical direction) is represented as $a_{zimu}$, in the body frame of the autonomous work vehicle 10. Furthermore, the roll rate is represented as $p_{imu}$ and the pitch rate is represented as $q_{imu}$.

The prediction for the IMU measurement vector is defined by equation 13 as:

$$h_{imu}^k = \begin{bmatrix} -g\sin\theta_1 \\ g\sin\phi_1\cos\theta_1 \\ g\cos\phi_1\cos\theta_1 \\ p+b_p \\ q+b_q \end{bmatrix}_k \quad (13)$$

where g is the value for gravity. The iteration value, k, is defined as the beginning of the measurement phase. Computing control gains used to control the autonomous work vehicle 10 be based on a generating a linearized version of equation 13 as shown by equation 14.

$$H_{imu} = \frac{\partial h_{imu}^k}{\partial \mu_{imu}} = \begin{bmatrix} 0 & -g\cos\theta_1 & 0 & 0 & 0 & 0 \\ g\cos\phi_1\cos\theta_1 & -g\sin\phi_1\sin\theta_1 & 0 & 0 & 0 & 0 \\ -g\sin\phi_1\cos\theta_1 & -g\cos\phi_1\sin\theta_1 & 0 & 0 & 0 & 0 \\ 0 & 0 & 1 & 0 & 1 & 0 \\ 0 & 0 & 0 & 1 & 0 & 1 \end{bmatrix}_k \quad (14)$$

The correction to the estimate is performed using standard Kalman filter update methods, as shown by equations 15 and 16.

$$K = P_k H^T_{imu}(H_{imu} P_k H^T_{imu} + Q_{imu})^{-1} \quad (15)$$

$$\mu_{imu}^{k+1} = \mu_{imu}^k + K(z_{imu} - h) \quad (16)$$

The covariance matrix is then updated by equation 17:

$$P_{k+1} = (I - KH_{imu})P_k(I - KH_{imu})^T + KQ_{imu}K \quad (17)$$

As mentioned above, the covariance matrix may provide an unscaled correlation of the inputs into the IMU Kalman filter 230, received as outputs from another Kalman filter. Furthermore, the covariance matrix may be used to fit a multivariate Gaussian distribution to the inputs into the IMU Kalman filter 230. In some embodiments, the covariance matrix, $p_{gps}^{k+1}$, determines an unscaled correlation (e.g., using equation 21). In some embodiments, the covariance matrix facilitates the computations that use the previous states, k, and the current state, k+1, to determine the inputs into the system that may achieve a desired control (e.g., movement) of the autonomous vehicle 10.

GPS Kalman Filter Prediction Phase

The GPS Kalman filter 250 receives accelerometer measurements from the IMU 80 as well as GPS measurements of position, velocity, and heading from the spatial positioning device 42. The measurements may be selected by the controller 32 from the full measurement vector (Zmacho 222). Furthermore, the GPS Kalman filter 250 determines (e.g., estimates) position, velocity, acceleration, and the acceleration biases (e.g., sensor offset in the average signal output indicative of the acceleration), to generate newly updated GPS states 294 to update the full state vector (xMACHO 224). In some embodiment, the spatial positioning device (e.g., GPS) is typically mounted away from the control point and its position is defined relative to the control point in the vehicle body frame, $\overline{X}_{off} = [x_{off} y_{off} z_{off}]^T$. In some embodiments, when another spatial positioning device/GPS is part of the autonomous work vehicle 10, another GPS Kalman filter 250 may be used to process the measurement and provide a second state estimate. As such, in certain embodiments, the algorithm 200 of FIG. 3 may be modified to include any other GPS Kalman filters.

The GPS state vector includes a subset of the vector from the full state vector (xMACHO 224) and is defined by equation 18 as:

$$\mu_{gps} = [x_1\ y_1\ z_1\ v_{x1}\ v_{y1}\ v_{z1}\ a_x\ a_y\ a_z\ b_{ax}\ b_{ay}\ b_{az}]^T \quad (18)$$
$$= [X_{i1}^T\ V_{i1}^T\ A_i^T\ B_a^T]^T$$

where the second form uses a 3 dimensional (3D) vector for position a 3D vector for velocity, $V_{i1}^T$, a 3D vector acceleration in the inertial reference frame, $A_i^T$, and a 3D vector for the acceleration biases, $B_a^T$ (e.g., sensor offset in the average signal output indicative of the acceleration along the x, y, and z directions). That is, the second form of equation 18 groups the x, y, and z components corresponding to the position, velocity, acceleration, and acceleration biases into respective 3D components of the GPS state vector. In some embodiments, at the start of prediction phase for the GPS Kalman filter 250, the GPS state vector of equation 18 may be an initialized vector 252, such that all of the entries include a value of 1 to facilitate computations.

The states corresponding to the GPS may update each control cycle using equation 19 to generate a newly updated GPS state 294.

$$\mu_{gps}^{k+1} = \mu_{gps}^k + \Delta t \begin{bmatrix} V_{i1} \\ A_{i1} \\ 0 \\ 0 \end{bmatrix}_k \quad (19)$$

where $\Delta t$ is the elapsed time 254 since the last cycle.

The updated GPS state 294 calculated by equation 19 is then linearized to obtain the state transition matrix $G_{gps}$ of equation 20.

$$G_{gps} = \begin{bmatrix} 1 & \Delta t & 0 & 0 \\ 0 & 1 & \Delta t & 0 \\ 0 & 0 & 1 & 0 \\ 0 & 0 & 0 & 1 \end{bmatrix} \quad (20)$$

The covariance, $p_{gps}^{k+1}$ is updated according to equation 21, based on the state transition matrix $G_{gps}$ and the process noise covariance matrix, $R_{gps}$, which includes signal noise. The covariance, $p_{gps}^{k+1}$ is associated with the GPS Kalman filter 250.

$$P_{gps}^{k+1} = G_{gps} P_{gps}^k G_{gps}^T + R_{gps} \quad (21)$$

In some embodiments, the covariance matrix, $p_{gps}^{k+1}$, determines an unscaled correlation (e.g., using equation 21). In some embodiments, the covariance matrix facilitates the computations that use the previous states, k, and the current state, k+1, to determine the inputs into the system that may achieve a desired control (e.g., movement) of the autonomous vehicle 10.

GPS Kalman Filter Measurement Phase

The GPS measurement vector includes a subset from the full measurement vector (Zmacho 222) and is defined by equation 22 as:

$$z_{gps} = [X_{gps}\ V_{gps}\ A_{imu}]^T \quad (22)$$

where $X_{gps}$ is the position of the GPS/the spatial positioning device in the inertial frame, $V_{gps}$ is the velocity of the GPS/the spatial positioning device) in the inertial frame, and $A_{imu}$ is the accelerations in the body frame of the autonomous work vehicle 10.

In some embodiments, the GPS may provide speed over the ground ($v_{gps}$) and track a direction of travel ($\psi_{gps}$). In some instances, the speed over the ground ($v_{gps}$) and the direction of travel ($\psi_{gps}$) are collectively converted to the velocity vector calculated in equation 23 as a way to reduce the effect of noise on $\psi_{gps}$ as the velocity approaches 0.

$$\begin{bmatrix} v_{xgps} \\ v_{ygps} \end{bmatrix} = \begin{bmatrix} v_{gps} \cos \psi_{gps} \\ v_{gps} \sin \psi_{gps} \end{bmatrix} \quad (23)$$

The prediction for the measurement vector for the GPS Kalman filter 250 from equation 22 is computed using equation 24.

$$h_{gps}^k = \begin{bmatrix} X_{i1} + R_{IB} X_{gpsoff} \\ V_{i1} + R_{IB} \Omega X_{gpsoff} \\ B_a + R_{IB}^T (A_i + [00g]^T) + \Omega^2 X_{imuoff} \end{bmatrix}_k \quad (24)$$

In certain embodiments, the position of the GPS measurement (e.g., in the measurement vector for the GPS Kalman filter 250) is predicted by taking the estimate of the position of the reference point, $X_i$, in the inertial frame and adding the GPS offset vector rotated into the inertial frame using the matrix $R_{IB}$. $R_{IB}$ is defined in equation 25 as:

$$R_{IB} = \begin{bmatrix} c\theta c\psi & s\phi s\theta c\psi - c\phi s\psi & c\phi s\theta c\psi + s\phi s\psi \\ c\theta s\psi & s\phi s\theta s\psi + c\phi c\psi & c\phi s\theta s\psi - s\phi c\psi \\ -s\theta & s\phi c\theta & c\phi c\theta \end{bmatrix} \quad (25)$$

where c and s are shorthand for cosine and sine, respectively.

The GPS velocity vector is predicted by taking the current estimate of velocity in the inertial frame, $V_i$, and adding the rotational velocity of the GPS about the control point. The GPS velocity vector, $V_{gps}$, is defined in equation 26 as:

$$V_{gps}=V_{i1}+\omega_b \times X_{gpsoff} \quad (26)$$

where $\omega_b$ is a vector of roll, pitch, and yaw rates in the body frame.

One way of determining the cross product (e.g., $\omega_b \times X_{gpsoff}$) is by using $\Omega X_{gpsoff}$. In some embodiments, $\Omega X_{gpsoff}$ may be a suitable substitute for $\omega_b \times X_{gpsoff}$). The cross product term can introduce velocities in any or all of the three elements (e.g., $V_{i1}$, $\omega_b$, $X_{gpsoff}$), depending on how the GPS is mounted. The rotational velocity matrix is defined in equation 27 as:

$$\Omega = \begin{bmatrix} 0 & -r & q \\ r & 0 & -p \\ -q & p & 0 \end{bmatrix} \quad (27)$$

The acceleration measurement is performed in the body frame because the IMU measures body motion. To predict the acceleration measurements with the GPS Kalman filter 250, the current acceleration estimate is rotated into the body frame, then added to accelerometer bias estimate and also added to the acceleration effects from rotational rate of the IMU 80. The prediction for the measurement vector for the GPS Kalman filter 250 computed in equation 24 is linearized by equation 28.

$$H_{gps} = \frac{\partial h_{gps}^k}{\partial \mu_{gps}} = \begin{bmatrix} I_3 & & O \\ & I_2 & \\ O & & R_{IB}^T \; I_3 \end{bmatrix} \quad (28)$$

The correction to the estimate is performed using standard Kalman filter update methods, as shown by equations 29 and 30.

$$K=P_k H_{gps}^T (H_{gps} P_k H_{gps}^T + Q_{gps})^{-1} \quad (29)$$

$$\mu_{gps}^{k-1}=\mu_{gps}^k + K(z_{gps}-h) \quad (30)$$

The covariance matrix is then updated by equation 31.

$$P_{k+1}=(I-KH_{gps})P_k(I-KH_{gps})^T + KQ_{gps}K \quad (31)$$

In some embodiments, the covariance matrix determines an unscaled correlation (e.g., using equation 31). In some embodiments, the covariance matrix facilitates the computations that use the previous states, k, and the current state, k+1, to determine the inputs into the system that may achieve the desired control (e.g., movement) of the autonomous vehicle 10.

Vehicle Kalman Filter Prediction Phase

The Vehicle Kalman filter 270 accepts the output from the GPS Kalman filter as well as the output of any other vehicle specific sensor such as steering sensor, radar velocity, encoders, lasers, sonar, etc. As such, in some embodiments, the inputs to the Vehicle Kalman filter 270 include values from the full measurement vector (Zmacho 222) and the full state vector (xMACHO 224).

The controller determines (e.g., estimates) the state vector for the Vehicle Kalman filter 270 to generate updated vehicle states 296. In some embodiments, a vehicle velocity sensor and/or a vehicle curvature sensor (e.g., wavefront curvature sensor) may be incorporated into the work vehicle to facilitate executing the prediction phase of the Vehicle Kalman Filter 270. With the following in mind, the vehicle state vector includes a subset of the values from the full state vector (xMACHO 224) and is defined in equation 32 as:

$$\mu_{veh}=[x\; y\; z\; \phi\; \theta\; \psi\; v\; \kappa\; b_r]^T \quad (32)$$

where $b_r$ is the yaw bias.

In some embodiments, at the start of the prediction phase for the Vehicle Kalman filter 270, the Vehicle state vector of equation 32 may be an initialized vector 272, such that all entries include a value of 1 to facilitate computations. The states in the vehicle state vector are predicted at each control cycle using equation 33 to generate a newly updated vehicle state 296.

$$\mu_{veh}^{k+1} = \mu_{veh}^k + \Delta t \begin{bmatrix} v \cos\theta \cos\psi \\ v \cos\theta \sin\psi \\ -v \sin\theta \\ v\kappa \cos\phi \tan\theta \\ -v\kappa \sin\phi \\ v\kappa \cos\phi \sec\theta \\ 0 \\ 0 \\ 0 \end{bmatrix}_k \quad (33)$$

where $\Delta t$ is the elapsed time 274 since the last cycle.

Furthermore, equation 33 may be linearized to obtain the state transition matrix, $G_{veh}$, corresponding to the Vehicle Kalman filter 270 may be computed by equation 34.

$$G_{veh} = \begin{bmatrix} 1 & & & & & & g_{x\theta} & g_{x\psi} & g_{xv} \\ & 1 & & & & & g_{y\theta} & g_{y\psi} & g_{yv} \\ & & 1 & & & & 0 & g_{z\theta} & g_{zv} \\ & & & g_{\phi\phi} & g_{\phi\theta} & 0 & & g_{\phi v} & g_{\phi\kappa} \\ & & & g_{\theta\phi} & 1 & 0 & & g_{\theta v} & g_{\theta\kappa} \\ & & & g_{\psi\phi} & g_{\psi\theta} & 1 & & g_{\psi v} & g_{\psi\kappa} \\ & & & & & & 1 & & \\ & & & & & & & & 1 \end{bmatrix} \quad (34)$$

where zeros occupy the empty spaces. The g terms are defined in equation 35, where:

$$g_{x\theta}=-v\Delta t \cos\psi \sin\theta$$

$$g_{x\psi}=-v\Delta t \cos\theta \sin\psi$$

$g_{xv} = \Delta t \cos \psi \cos \theta$ $g_{y\theta} = -v\Delta t \sin \psi \sin \theta$ $g_{y\psi} = v\Delta t \cos \psi \cos \theta$ $g_{yv} = \Delta t \cos \theta \sin \psi$ $g_{z\theta} = -v\Delta t \cos \theta$ $g_{zv} = -\Delta t \sin \theta$ $g_{\phi\phi} = 1 - \kappa v \Delta t \sin \phi \tan \theta$ $g_{\phi\theta} = \kappa v \Delta t \cos \phi \sec^2 \theta$ $g_{\phi v} = \kappa \Delta t \cos \phi \tan \theta$ $g_{\phi\kappa} = v\Delta t \cos \phi \tan \theta$ $g_{\theta\phi} = -\kappa v \Delta t \cos \theta$ $g_{\theta v} = -\kappa \Delta t \sin \theta$ $g_{\theta\kappa} = -v\Delta t \sin \theta$ $g_{\psi\phi} = -\kappa v \Delta t \sec \theta \sin \phi$ $g_{\psi\theta} = \kappa v \Delta t \cos \theta \sec \theta \tan \theta$ $g_{\psi v} = \kappa \Delta t \cos \phi \sec \theta$ $g_{\psi\kappa} = v\Delta t \cos \theta \sec \theta \qquad (35)$ After performing the calculations in equation 34, the covariance for the vehicle Kalman filter 270, $p_{veh}^{k+1}$, is updated with the state transition matrix $G_{veh}$ and the process noise covariance matrix, $R_{veh}$, according to equation 36.

$P_{veh}^{k+1} = G_{veh} P_{veh}^k G_{veh}^T + R_{veh} \qquad (36)$

Vehicle Kalman Filter Measurement Phase

The vehicle measurement vector is defined is equation 37 as:

$$z_{veh} = [x_1\ y_1\ z_1\ \phi_1\ \theta_1\ v\ \kappa\ r\ v_{x1}\ v_{y1}\ v_{z1}]^T \qquad (37)$$
$$= [X_{i1}^T\ \phi_1\ \theta_1\ v\ \kappa\ r\ V_{i1}^T]^T$$

Where $X_{i1}^T$ represents the position estimate from the GPS Kalman filter, $\Phi_1$ represents the roll angle estimate from the IMU Kalman filter 230, $\theta_1$ represents the pitch angle estimate from the IMU Kalman filter 230, v represents the vehicle velocity from the GPS Kalman filter 250, k represents the vehicle curvature from the GPS Kalman filter 250, r represents the yaw rate from the GPS Kalman filter 250, and $V_{i1}^T$ represents the inertial velocity estimates from the GPS Kalman filter.

After propagating values for the vehicle measurement vector of equation 37, the prediction for the vehicle measurement vector is obtained using equation 38 as:

$$h_{veh}^k = \begin{bmatrix} x \\ y \\ z \\ \phi \\ \theta \\ v \\ \kappa \\ v\kappa + b_r \\ v\cos\theta\cos\psi \\ v\cos\theta\sin\psi \\ -v\sin\theta \end{bmatrix} \qquad (38)$$

In some embodiments, determining gains used to control the work vehicle (e.g., control the states/variables of equation 37) may be facilitated by generating a linearized version of equation 38, as shown by equation 39.

$$H_{veh} = \frac{\partial h_{veh}^k}{\partial \mu_{veh}} = \qquad (39)$$

$$\begin{bmatrix} I_5 & & & & & O \\ O & & & I_2 & & O \\ & 0 & 0 & & \kappa & v & 1 \\ & -v\sin\theta\cos\psi & -v\cos\theta\sin\psi & & \cos\theta\cos\psi & 0 & 0 \\ O & -v\sin\theta\sin\psi & v\cos\theta\cos\psi & & \cos\theta\sin\psi & 0 & 0 \\ & -v\cos\theta & 0 & & -\sin\theta & 0 & 0 \end{bmatrix}$$

The correction to the estimate is performed using standard Kalman filter update methods, as shown by equations 40 and 41.

$K = P_k H_{veh}^T (H_{veh} P_k H_{veh}^T + Q_{veh})^{-1} \qquad (40)$ $\mu_{veh}^{k-1} = \mu_{veh}^k + K(z_{veh} - h)_k \qquad (41)$ The covariance matrix is the updated according to equation 42.

$P_{k-1} = (I - KH_{veh}) P_k (I - KH_{veh})^T + KQ_{veh} K \qquad (42)$

While only certain features have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A control system for a work vehicle, comprising:
 a controller, comprising:
  a processor; and
  a memory device communicatively coupled to the processor and configured to store instructions configured to cause the processor to:
   receive, via a sensor assembly, sensor signals;
   convert the sensor signals into a plurality of entries of a full measurement vector;
   determine a first state vector using an inertial measuring unit (IMU) Kalman filter based on the full measurement vector and a full state vector, and update a first subset of entries of a plurality of entries of the full state vector based on the first state vector;
   determine a second state vector using a spatial positioning Kalman filter based on the full measurement vector and the full state vector, and update a second subset of entries of the plurality of entries of the full state vector based on the second state vector;

determine a third state vector using a vehicle Kalman filter based on the full measurement vector and the full state vector, and update a third subset of entries of the plurality of entries of the full state vector based on the third state vector; and control movement of the work vehicle based on at least one of the first state vector, the second state vector, the third state vector, and the full state vector, wherein the IMU Kalman filter, the spatial positioning Kalman filter, and the vehicle Kalman filter each include a prediction phase and a measurement phase that are unique to the respective filter, and wherein the instructions are further configured to cause the processor to execute the prediction phases of the IMU Kalman filter, the spatial positioning Kalman filter, and the vehicle Kalman filter independently of one another.

2. The control system of claim 1, wherein the instructions are configured cause the processor to:
determine the first state vector in response to receiving a first subset of entries of a plurality of entries of the full measurement vector are received;
determine the second state vector in response to receiving a second subset of entries of the plurality of entries of the full measurement vector are received; and
determine the third state vector in response to receiving a third subset of entries of the plurality of entries of the full measurement vector are received.

3. The control system of claim 1 wherein the plurality of entries of the full measurement vector comprise a roll rate, a pitch rate, and a yaw rate determined based on the sensor signals from an IMU sensor, an acceleration along a longitudinal axis, a lateral axis, and a vertical axis determined based on the sensor signals from the IMU sensor, a position and velocity along the longitudinal axis, the lateral axis, and the vertical axis determined based on the sensor signals from a spatial positioning device, and two variables used to compute a yaw rate.

4. The control system of claim 1, wherein the plurality of entries of the full measurement vector comprise at least one of the first subset of entries of the first state vector, the second subset of entries of the second state vector, and the third subset of entries of the third state vector.

5. The controller of claim 1, wherein the first state vector comprises a roll angle, a pitch angle, a roll rate, a pitch rate, a roll rate bias, or a combination thereof;
wherein the second state vector comprises a position, a velocity, an acceleration, and an acceleration bias each along a longitudinal axis, a lateral axis, a vertical axis, or any combination thereof; and
wherein the third state vector comprises the position along the longitudinal direction, the position along the lateral direction, the position along the vertical axis, the roll angle, the pitch angle, a direction of travel, the yaw bias, two variables used to compute a yaw rate, or any combination thereof.

6. The controller of claim 1, wherein the instructions are configured to cause the processor to determine the second state vector based on the first state vector, the third state vector, the full measurement vector, or any combination thereof.

7. The controller of claim 1, wherein the first state vector shares entries with the second state vector, the third state vector, the full measurement vector, or any combination thereof.

8. The autonomous work vehicle of claim 1, wherein a portion of the plurality of entries of the full measurement vector are shared as a portion of the plurality of entries of the full state vector.

9. The autonomous work vehicle of claim 8, wherein the instructions configured to cause the processor to control the movement of the work vehicle comprise actuating one or more actuators.

10. The autonomous work vehicle of claim 1, wherein each of the instructions configured to determine the first, second, and third state vectors comprise updating a corresponding covariance matrix based on a corresponding state transition matrix and a corresponding process noise covariance matrix.

11. A tangible, non-transitory, computer-readable medium that stores instructions executable by a processor, wherein the instructions are configured to cause the processor to:
receive, via a sensor assembly, sensor signals;
convert the sensor signals into a plurality of entries of a full measurement vector;
determine a first state vector using an inertial measuring unit (IMU) Kalman filter based on the full measurement vector and a full state vector, and update a first subset of entries of a plurality of entries of the full state vector based on the first state vector;
determine a second state vector using a spatial positioning Kalman filter based on the full measurement vector and the full state vector, and update a second subset of entries of the plurality of entries of the full state vector based on the second state vector;
determine a third state vector using a vehicle Kalman filter based on the full measurement vector and the full state vector, and update a third subset of entries of the plurality of entries of the full state vector based on the third state vector; and
control movement of the work vehicle based on at least one of the first state vector, the second state vector, the third state vector, and the full state vector,
wherein the IMU Kalman filter, the spatial positioning Kalman filter, and the vehicle Kalman filter each include a prediction phase and a measurement phase that are unique to the respective filter, and
wherein the instructions are further configured to cause the processor to execute the prediction phases of the IMU Kalman filter, the spatial positioning Kalman filter, and the vehicle Kalman filter independently of one another.

12. The tangible, non-transitory, and computer-readable medium of claim 11, wherein the instructions configured to determine each of the first, second, and third state vector occur in parallel to one another.

13. The tangible, non-transitory, and computer-readable medium of claim 11, wherein the instructions are configured to cause the processor to determine the first state vector based on the second state vector, the third state vector, the full measurement vector, or any combination thereof.

14. The tangible, non-transitory, and computer-readable medium of claim 11, wherein the instructions are configured to cause the processor to determine the third state vector based on the first state vector, the second state vector, the full measurement vector, or any combination thereof.

15. The tangible, non-transitory, and computer-readable medium of claim 11, wherein each of the instructions configured to determine the first, second, and third state vectors comprise updating a corresponding covariance matrix based on a corresponding state transition matrix and a corresponding process noise covariance matrix.

16. A method for controlling an autonomous work vehicle, comprising:
receiving, via a sensor assembly communicatively coupled to a processor, sensor signals;
converting, via the processor, the sensor signals into a plurality of entries of a full measurement vector;
determining, via the processor, a first state vector using an inertial measuring unit (IMU) Kalman filter based on the full measurement vector and a full state vector, and updating a first subset of entries of a plurality of entries of the full state vector based on the first state vector, wherein determining the first state vector using the IMU Kalman filter comprises executing a prediction phase and a measurement phase of the IMU Kalman filter;
determining, via the processor, a second state vector using a spatial positioning Kalman filter based on the full measurement vector and the full state vector, and updating a second subset of entries of the plurality of entries of the full state vector based on the second state vector, wherein determining the first state vector using the spatial positioning Kalman filter comprises executing a prediction phase and a measurement phase of the spatial positioning Kalman filter;
determining, via the processor, a third state vector using a vehicle Kalman filter based on the full measurement vector and the full state vector, and update a third subset of entries of the plurality of entries of the full state vector based on the third state vector, wherein determining the first state vector using the vehicle Kalman filter comprises executing a prediction phase and a measurement phase of the vehicle Kalman filter,
wherein execution of the prediction phases of the IMU Kalman filter, the spatial positioning Kalman filter, and the vehicle Kalman filter is done independently of one another; and
the method further comprising controlling, via the processor, movement of the autonomous work vehicle based on at least one of the first state vector, the second state vector, the third state vector, and the full state vector.

17. The method of claim 16, comprising:
periodically determining, via the processor, the first state vector in response to receiving a first subset of entries of a plurality of entries of the full measurement vector are received;
periodically determining, via the processor, the second state vector in response to receiving a second subset of entries of the plurality of entries of the full measurement vector are received; and
periodically determining, via the processor, the third state vector in response to receiving a third subset of entries of the plurality of entries of the full measurement vector are received.

18. The method of claim 16, wherein determining the first, second, and third state vectors comprise updating a corresponding covariance matrix based on a corresponding state transition matrix and a corresponding process noise covariance matrix.

19. The method of claim 16, wherein controlling the movement of the autonomous work vehicle comprises actuating one or more actuators based on the full state vector and the full measurement vector.

20. The method of claim 19, wherein controlling the movement of the autonomous work vehicle comprises actuating the one or more actuators based on control gains based on a linear model.

* * * * *